United States Patent [19]

Quick

[11] 4,141,138
[45] Feb. 27, 1979

[54] TOOL FOR INSERTING AND EXTRACTING INTEGRATED CIRCUITS

[75] Inventor: Gary K. Quick, Olathe, Kans.

[73] Assignee: King Radio Corporation, Olathe, Kans.

[21] Appl. No.: 801,805

[22] Filed: May 31, 1977

[51] Int. Cl.² ............................................. H05K 3/30
[52] U.S. Cl. ...................................... 29/740; 29/741; 29/758; 29/764
[58] Field of Search ................. 29/764, 739, 740, 741, 29/762, 758, 626

[56] References Cited

U.S. PATENT DOCUMENTS 3,842,478  10/1974  Schreckeneder ................. 29/764 X
4,033,032  7/1977  Romania et al. ..................... 29/764

Primary Examiner—Carl E. Hall
Attorney, Agent, or Firm—Lowe, Kokjer, Kircher, Wharton & Bowman

[57] ABSTRACT

A tool for handling integrated circuits to facilitate their installation on and extraction from circuit boards. A pair of spaced apart levers are pivotal about integral hinges in a manner to engage opposite ends of the integrated circuit. Each lever carries a pair of lugs between which the ends of the integrated circuit are gripped. The opposite end of the tool is constructed similarly although with a pair of levers that are closer together in order to handle a smaller integrated circuit.

9 Claims, 3 Drawing Figures

TOOL FOR INSERTING AND EXTRACTING INTEGRATED CIRCUITS

BACKGROUND AND SUMMARY OF THE INVENTION

This invention relates to a tool which provides assistance in handling integrated circuits to facilitate their insertion on and extraction from a circuit board.

The tools which are presently available for use in inserting and extracting integrated circuits have not been entirely satisfactory in all respects. Characteristically, such tools include a pair of jaws which are hingedly connected and urged together by a spring. The jaws act to grip opposite sides of an integrated circuit and thus assist in installing and removing it. Whoever, since the pins are normally located along the sides of the IC, gripping on the sides often results in engagement of the jaws with the frail pins, thereby bending or otherwise damaging them. Further, the jaws are not able to clear the sides of the sockets on all circuit boards, and in some cases they contact adjacent components. Consequently, such devices are not suitable for use with all types of integrated circuits and circuit boards.

Other types of tools are suitable to serve either as installing devices or extracting devices, but not both. Moreover, these tools are typically capable of use with integrated circuits of only one size, and separate tools must therefore be provided for each size integrated circuit. The prior art devices also have a tendency to bend, chip, or otherwise damage the IC since the forces applied to it are localized rather than equally distributed. A further problem has resulted from the tendency of existing tools to lift one side or end of the IC before the other, thereby bending the unreleased pins. This latter problem is particularly acute for integrated circuits having a large number of pins.

It is the primary object of the present invention to provide an improved tool which may be used to quickly and easily insert and extract integrated circuits.

More specifically, it is an object of the invention to provide an insertion and extraction tool which is applied to the ends of the integrated circuit in order to avoid contact with the pins.

Another object of the invention is to provide a tool having a configuration and arrangement to alternately handle integrated circuits of different sizes.

Yet another object of the invention is to provide a tool of the character described having small gripping lugs which are able to accommodate virtually all sockets and which are able to clear adjacent components on the circuit board.

A further object of the invention is to provide a tool of the character described which includes means for spreading the insertion and extraction forces substantially equally over the integrated circuit to which it is applied.

An additional object of the invention is to provide a tool of the character described which is capable of inserting and removing integrated circuits without bending the pins or causing other damage.

A still further object of the invention is to provide a tool of the character described which is constructed simply and economically and which is readily adaptable to integrated circuits of all sizes and numbers of pins.

Other and further objects of the invention, together with the features of novelty appurtenant thereto, will appear in the course of the following description.

DETAILED DESCRIPTION OF THE INVENTION

In the accompanying drawing which forms a part of this specification and is to be read in conjunction therewith, and in which like reference numerals are employed to indicate like parts in the various views.

Figure 1:
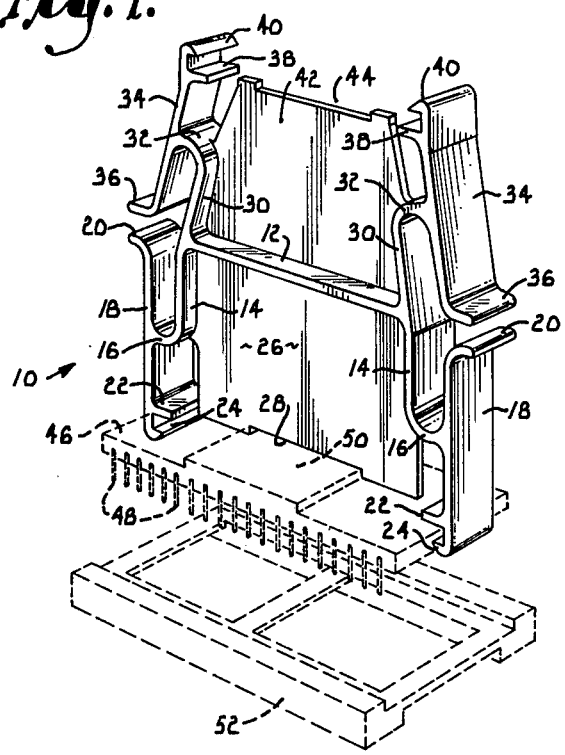
FIG. 1 is a perspective view of a tool constructed according to a preferred embodiment of the present invention applied to an integrated circuit, the latter being shown in broken lines along with its receiving socket.

Referring to the drawing in more detail, numeral 10 generally designates a tool constructed according to the invention. The tool 10 is preferably formed of a hard, resilient plastic or a similar substance which is molded in a single piece construction. A straight cross member 12 substantially spans the tool at its approximate midpoint. Integral with and extending generally downwardly from opposite ends of member 12 are hinges 14. Each hinge curves gradually outwardly to provide a generally horizontal hinge portion 16 which is integral at its outer end with a lever 18.

The levers 18 are constructed identically to one another although they are reversed in orientation. The levers are substantially perpendicular to their hinge portions 16 and connect therewith at locations slightly above the midpoints of the levers. At its top end, each lever 18 is turned outwardly to provide a tab 20. Hinge portions 16 are flexible enough to permit levers 18 to be pivoted between the positions shown in solid and broken lines in FIG. 2, with the resiliency of the hinges urging the levers toward the stable solid line position.

The lower end of each lever 18 carries a pair of inwardly projecting tangs or lugs 22 and 24 which are spaced apart from one another. The upper lug 22 in each pair projects inwardly to a greater extent that the lower lug 24, while each lower lug has a smoothly curved bottom surface which terminates in an inwardly directed edge. The area between lugs 22 and 24 is squared off to accommodate the edges of an integrated circuit, as will be explained in more detail.

Figure 3:
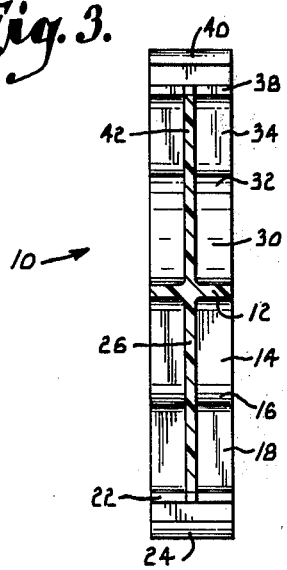
FIG. 3 is a sectional view taken generally along line 3—3 of FIG. 2 in the direction of the arrows.

A flat plate 26 is formed integrally with cross member 12 and hinges 14. As best illustrated in FIG. 3, plate 26 is located midway of the width of members 12 and 14. The lower edge of plate 26 is provided with a central cut out area 28.

The upper half of tool 10 is constructed and arranged substantially identically to the lower half, although its size differs to permit it to handle smaller integrated circuits. A pair of hinges 30 extend integrally from the opposite ends of member 12. The hinges each extend upwardly and are curved outwardly to provide generally horizontal hinge portions 32. At its outer end, each hinge portion 32 connects with a lever 34 intermediately along the length thereof. Levers 34 are able to pivot on portions 32 in the same manner as described for levers 18. The resiliency of the hinges urges levers 34 toward the stable position shown in FIG. 2.

Each lever 34 has a tab 36 at one end and a pair of inwardly projecting tangs or lugs 38 and 40 at its opposite end. The lugs in each pair are spaced apart in order to receive the edge of an integrated circuit therebetween. The end lug 40 projects inwardly to a lesser extent than lug 38 and has a curved surface that terminates in an inwardly directed edge. The ends of levers 34 which carry lugs 38 and 40 are closer together than the corresponding ends of levers 18. Accordingly, levers 34 are able to handle an IC of smaller size than that which levers 18 are intended to handle.

Integral with member 12 and hinges 30 is a flat plate 42 which is in the same plane as plate 26. A cut out area 44 is formed centrally on the free edge of plate 42.

In use, the tool 10 provides assistance in the insertion and extraction of an integrated circuit such as that shown in broken lines in FIG. 1 and designated by numeral 46. The IC has 40 pins 48, 20 of which are arranged in a row extending along each side. The IC also has a raised central area 50 at its center.

Figure 2:
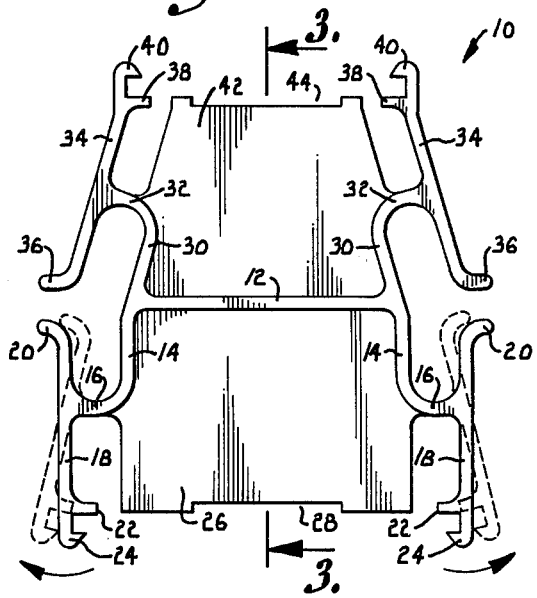
FIG. 2 is a front elevational view of the tool shown in FIG. 1, with the broken lines indicating movement of one pair of levers to the release position.

To insert the IC 46 is a socket 52 of a conventional circuit board (not shown), tabs 20 are pressed inwardly with the thumb and forefinger to pivot levers 18 to the broken line position shown in FIG. 2. Lugs 22 and 24 are then applied to the opposite ends of the IC so that when the tabs are released, the lugs grip the IC in a manner shown in FIG. 1. In this position, the opposite end edges of the IC are closely received between the lugs, with the upper lug 22 lying against the top surface of the IC and the lower lug 24 lying against its lower surface. The tool is then held by plate 42 or cross member 12 and moved straight downwardly to install the IC 46 in its receiving socket 52, with the pins 48 entering their receptacles without being bent or otherwise deformed.

After insertion, tabs 20 are again pressed inwardly to move lugs 22 and 24 to the release position. The curved surfaces of lugs 24 facilitate their removal from the socket 52 and from beneath the IC. The small size of the lugs allows them to easily clear the socket and the adjacent components on the circuit board (not shown).

To extract the IC 46 from socket 52, tabs 20 are pressed inwardly and tool 10 is applied to the IC in a manner to insert lugs 24 beneath its opposite ends. Again, the curved surfaces of the lugs assure proper application of the tool to the IC. With tabs 20 released such that opposite ends of the IC are held between lugs 22 and 24, the tool is raised straight upwardly to remove the IC without bending its pins 48. The tool is thereafter released to deposit the IC in a storage area or the like.

It should be apparent that the opposite half of the tool may be employed in essentially the same manner to install and remove integrated circuits which have a smaller size than IC 46. The distance between the ends of levers 34 is equal to the length of a standard 28 pin IC (not shown). Consequently, the tool 10 is able to handle both 28 pin and 40 pin integrated circuits. It will be appreciated, however, that the tool may be constructed to handle integrated circuits having any size, configuration, or number of pins.

It is noted that the free edges of plates 26 and 42 substantially span the distance between levers 18 and levers 34, respectively. When the tool is applied to an IC, the plate edge engages the upper surface of the IC substantially continuously along its entire length, with the cut outs 28 and 44 accommodating the raised portion 50. By virtue also of the equalization of forces achieved by the central cross member 12, the forces applied to the IC during insertion are distributed substantially equally over its upper surface. Therefore, there are no localized areas of excessive stress that could possibly result in damage to the IC. Also, the uniform support provided by cross member 12 and by plates 26 and 42 prevents excessive twisting of the IC and possible bending of the pins as the tool is being raised.

Application of the tool to the ends of the IC rather than the sides is important because the frail pins 48 are arranged flush with or nearly flush with both sides. Consequently, gripping of the IC on the ends avoids contact with and possible damage to the pins, as well as allowing use of a smaller sized tool.

From the foregoing it will be seen that this invention is one well adapted to attain all ends and objects hereinabove set forth together with the other advantages which are obvious and which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative and not in a limiting sense.

Having thus described the invention, I claim:

1. A tool for assisting in the insertion of an integrated circuit on a circuit board and the extraction of same from the circuit board, said tool comprising:
   a frame;
   a pair of spaced apart levers for engaging and releasing the integrated circuit each lever having a gripping portion and a movement imparting portion;
   gripping means on each lever for gripping opposite ends of the integrated circuit to facilitate insertion and extraction of same, said gripping means being located at the gripping portion of each lever; and
   a hinge connection associated with each lever, said hinge connection being operable to couple its associated lever in spaced apart relationship with the frame such that the gripping portion and the movement imparting portion of the lever extend outward from said hinge connection in opposite directions and to allow its associated lever to pivot about the hinge connection in response to a force applied to the movement imparting portion of the lever.

2. A tool as set forth in claim 1, wherein said gripping means comprises a pair of spaced apart lugs carried on each lever to engage the top and bottom surfaces of the integrated circuit at the opposite ends thereof.

3. A tool as set forth in claim 2, including a smoothly curved surface on one lug in each pair to facilitate release of said one lug from the bottom surface of the integrated circuit.

4. A tool as set forth in claim 1, including a support member on said frame extending substantially between said levers at a location to engage the upper surface of the integrated circuit substantially continuously along the length thereof when said levers are applied to opposite ends of the circuit.

5. A tool as set forth in claim 1, wherein said hinge connections are integral with the respective levers and with said frame.

6. A tool as set forth in claim 1, wherein said frame includes a cross member substantially spanning same, said hinge connections coupling the respective levers with opposite ends of said cross member.

7. A tool as set forth in claim 6, wherein said hinge connections are integral with said cross member and with said levers.

8. A tool as set forth in claim 6, including a plate member connected with said cross member and with each hinge connection, said plate member having an edge positioned to engage the upper surface of the integrated circuit substantially continuously along the length thereof when said levers are applied to opposite ends of the circuit.

9. A tool as set forth in claim 1, including:
- a second pair of spaced apart levers each lever having a gripping portion and a movement imparting portion;
- gripping means on each lever in said second pair for gripping opposite ends of integrated circuits to facilitate insertion and extraction of same, said gripping means being located at the gripping portion of each lever; and
- a hinge connection associated with each lever in said second pair to couple the levers in said second pair to said frame such that the gripping portions of levers in the second pair project in a generally opposite direction from the gripping portions of the levers in the first mentioned pair, said hinge connection being operable to couple its associated lever in spaced apart relationship with the frame such that the gripping portion and the movement imparting portion of the lever extend outward from said hinge connection in opposite directions and to allow its associated lever to pivot about the hinge connection in response to a force applied to the movement imparting portion of the lever.

* * * * *